(12) United States Patent
Wong et al.

(10) Patent No.: US 7,194,666 B1
(45) Date of Patent: Mar. 20, 2007

(54) BIT ERROR RATE TESTER IMPLEMENTED IN A PROGRAMMABLE LOGIC DEVICE

(75) Inventors: San Wong, Cupertino, CA (US); Kaiyu Ren, San Jose, CA (US)

(73) Assignee: Altera Corporation, San Jose, CA (US)

( * ) Notice: Subject to any disclaimer, the term of this patent is extended or adjusted under 35 U.S.C. 154(b) by 471 days.

(21) Appl. No.: 10/725,898

(22) Filed: Dec. 1, 2003

(51) Int. Cl.
*G06F 11/00* (2006.01)
*G01R 31/28* (2006.01)

(52) U.S. Cl. ............................. 714/704; 714/725

(58) Field of Classification Search ........ 714/704–708, 714/725, 731; 716/16–17
See application file for complete search history.

(56) References Cited

U.S. PATENT DOCUMENTS

| | | | | |
|---|---|---|---|---|
| 6,628,621 | B1 * | 9/2003 | Appleton et al. | 370/249 |
| 7,032,139 | B1 * | 4/2006 | Iryami et al. | 714/704 |
| 2005/0050190 | A1 * | 3/2005 | Dube | 709/223 |

OTHER PUBLICATIONS

"How Programmable Logic Works" by Michael Barr published Jun. 1999, Embedded Systems Programming on pp. 75-84 located on the web at http://www.netrino.com/Articles/ProgrammableLogic/index.html.*

"Jitter Fundamentals: Agilent N4900 Serial BERT Series Jitter Injection and Analysis Capabilities," Application Note, Agilent Technologies, Nov. 2003, pp. 1-24.

"Understanding and Characterizing Timiing Jitter," Tektronix, www.tektronix.com/jitter, 2003, pp. 1-24.

"Annex 48B: Jitter test methods," IEEE Std 802.3ae-2002, IEEE, 2002, pp. 505-514.

Wang, et al., "Equalization Techniques," Carleton University, presentation slides.

* cited by examiner

*Primary Examiner*—Cynthia Britt
(74) *Attorney, Agent, or Firm*—Fish & Neave IP Group Ropes & Gray LLP; Alexander Shvarts

(57) ABSTRACT

The present invention provides a bit error rate tester implemented in a programmable logic device. Any or all of the components of the bit error rate tester may be implemented through software by programming the programmable logic circuitry of the programmable logic device to implement the components of the bit error rate tester. The bit error tester may determine the bit error rate of any suitable interface either within the programmable logic device or external to the programmable logic device. In order to allow a user to interact with the bit error rate tester, user equipment, such as a personal computer, may be coupled to the bit error rate tester.

28 Claims, 4 Drawing Sheets

BIT ERROR RATE TESTER IMPLEMENTED IN A PROGRAMMABLE LOGIC DEVICE

BACKGROUND OF THE INVENTION

The present invention relates to bit error rate testing, and more particularly, the present invention relates to bit error rate testing using programmable logic devices.

The input/output throughput of programmable logic devices, as well as other types of integrated circuits, is currently on the order of gigabits per second and continues to rise. With this high rate of data throughput, an area of concern arises with regard to bit error rate. The higher the bit error rate of a particular device, then the more bits need to be retransmitted, thus decreasing the overall data transfer rate. This clearly makes inefficient the high throughput rates of some of these devices when a high bit error rate is present.

It therefore becomes important to be able to gauge the bit error rate of any particular device or type of device. Knowing the bit error rate of devices allows designers and engineers to choose appropriate devices that are required to exhibit a particular (e.g., minimum) data transfer rate for a particular design or application.

Bit error rates are typically ascertained through the use of a bit error rate tester. Known bit error rate testers are typically expensive dedicated external equipment that is connected to the device to be tested. Vendors such as Agilent Technologies of Palo Alto, Calif. manufacture and market such bit error rate testers. Bit error rate measurement using such equipment may require on the order of days to complete. For example, it takes nearly four days to verify a bit error rate of 10E-14 (i.e., one error in 10E14 bits on average) at a 3 gigabit per second data rate.

It would therefore be desirable to provide a more efficient bit error rate tester for verifying the bit error rate of programmable logic devices.

SUMMARY OF THE INVENTION

It is therefore an object of the present invention to provide a more efficient bit error rate tester for verifying the bit error rate of a particular interface.

This and other objects of the present invention are accomplished by providing a programmable logic device that is configured to implement the functionality of a bit error rate tester. The bit error rate tester functionality may be entirely implemented in programmable logic circuitry programmed using any suitable software (e.g., circuit design software, hardware description language, any suitable software-to-hardware compiler, etc.) Alternatively, any portion of the bit error rate tester may be implemented as hardwired circuitry that may be integrated in a programmable logic device or in a separate integrated circuit that is coupled to the programmable logic device.

The bit error rate tester implemented in the programmable logic device may be efficiently used to test the bit error rate of any interfaces associated with the programmable logic device, including any input/output components that interface the chip with external devices or any input/output components internal to the chip, such as memory interfaces accessible via intra-chip resources. The bit error rate tester may also be used as stand-alone testing equipment for testing the bit error rate of external devices that are distinct and independent from the programmable logic device in which the bit error rate tester is implemented.

The bit error rate tester of the present invention may be implemented by programming programmable logic circuitry to implement transmission circuitry that communicates test data across the interface being tested and comparison circuitry that receives the test data from the interface's output. The output data is compared to comparison data, which corresponds to the original test data in order to determine whether any errors occurred to the data as it was communicated across the interface. Control circuitry, which may be in the form of a software-programmed processor, may also be used to control the operation of the transmission and comparison circuitry. User equipment, such as a personal computer, may be coupled to the bit error rate tester in order to provide a user with testing information and in order to provide the user with any suitable level of control over the testing procedure.

BRIEF DESCRIPTION OF THE DRAWINGS

The above and other objects of the present invention will be apparent upon consideration of the following detailed description, taken in conjunction with the accompanying drawings, in which like reference characters refer to like parts throughout, and in which.

DETAILED DESCRIPTION OF THE INVENTION

The present invention provides a more efficient bit error rate tester implemented using a programmable logic device. In particular, one or more programmable logic devices may be programmed to implement the features of a bit error rate tester in order to verify the bit error rate of that programmable logic device's one or more interfaces or of any other suitable interface. For example, a bit error rate tester implemented on or more programmable logic devices may be used to test the bit error rate of an interface that is distinct and independent from these programmable logic devices. An interface may include any suitable input/output component of a circuit or device. For example, the input/output component of memory, such as RAM, EPROM, ROM, or the like, the input/output components of programmable logic devices, other integrated circuits, or any other suitable input/output component may be considered an interface for purposes of the present invention.

Any suitable technique for programming a programmable logic device may be used to configure a particular programmable logic device to implement any or all components of a bit error rate tester in accordance with the present invention. For example, a hardware compiler application, such as the Quartus® II design software provided by the Altera® Corporation of San Jose, Calif., may be used.

Figure 1:
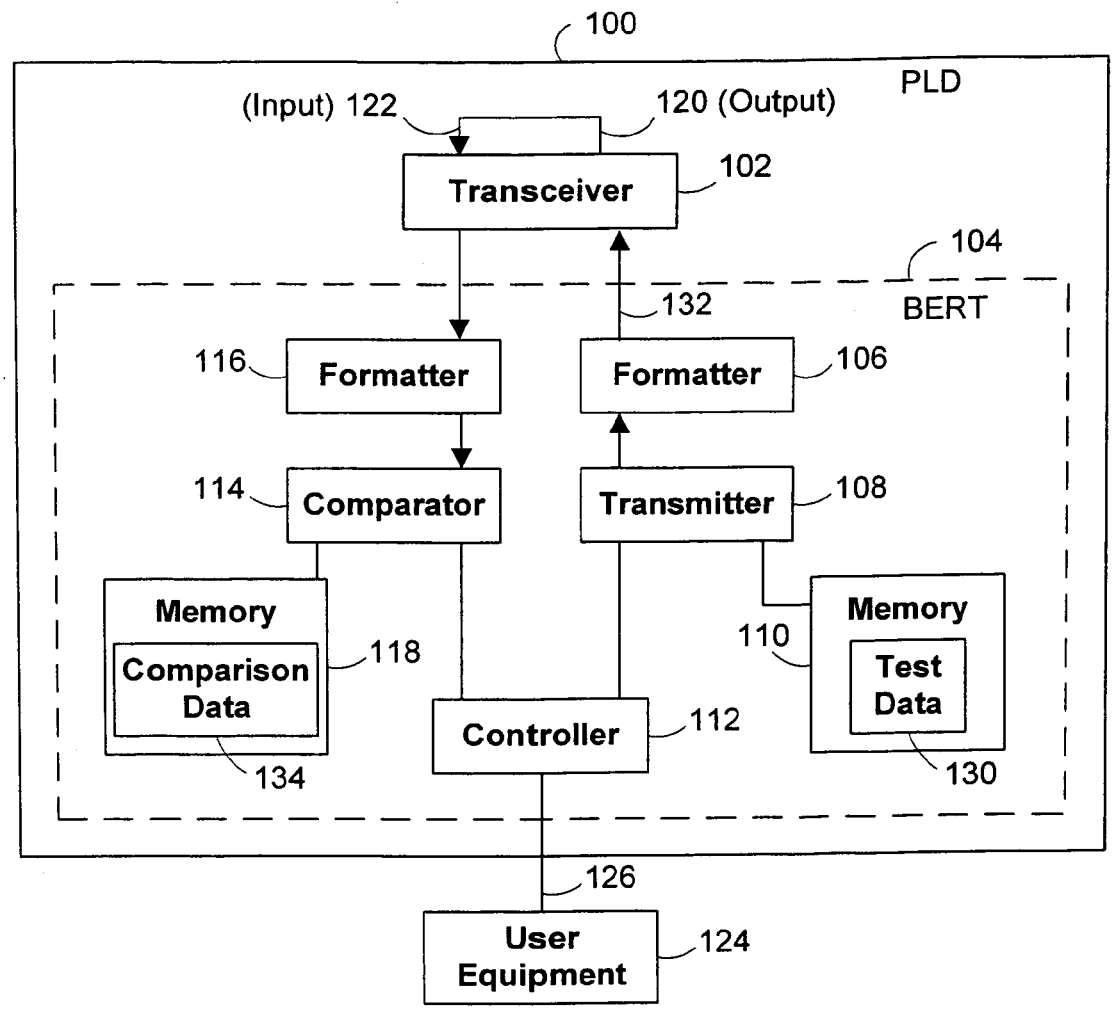
FIG. 1 is a block diagram of an illustrative system having an illustrative programmable logic device on which a bit error rate tester is implemented in accordance with one embodiment of the present invention.

FIG. 1 shows a programmable logic device 100 having been illustratively programmed to implement a bit error rate tester in accordance with the present invention. Programmable logic device 100 may be any suitable programmable logic device capable of implementing the functionality of a bit error rate tester in accordance with the present invention. For example, a particular programmable logic device may be chosen based on throughput requirements for a particular application of the resultant bit error rate tester (e.g., a higher throughput programmable logic device may be used to implement a bit error rate tester for testing high-speed memory).

Circuitry 104 is programmed to implement a bit error rate tester. Any suitable implementation of a bit error rate tester may be used. In the illustrated example, bit error rate tester 104 may include transmission circuitry, comparison circuitry, and control circuitry. The transmission circuitry includes, for example, embedded memory 110, transmitter 108, and formatter 106. Embedded memory 110 may be any suitable volatile or non-volatile memory (e.g., RAM, ROM, EPROM, etc.) Embedded memory 110 stores test data 130. Test data 130 may be any suitable data for bit error rate testing. Such data may be, for example, any arbitrary bit stream of any suitable size, user-defined data patterns, predefined data patterns, or any other suitable data.

Embedded memory 110 is coupled to transmitter 108. Transmitter 108 may include any suitable circuitry configured to access test data 130 being stored in embedded memory 110 and to transmit test data 130 to a suitable destination. For example, transmitter 108 may transmit test data 130 to formatter 106. Formatter 106 may be any suitable circuitry configured to format test data 130 into a particular bit stream with which bit error rate tester 104, the interface being tested (i.e., transceiver 102 in the illustrated example), or both are configured to work. Formatter 106 may, for example, add idle bits to the test data bit stream, remove certain bits, or perform any other suitable manipulation of the test data. For example, if transceiver 102 accepts only bits streams of a single word (i.e., 32 bits) and if test data 130 is stored as a double word in embedded memory 110, then formatter 106 may divide test data 130 into single word bit streams.

In some embodiments of the present invention, formatter 106 may be unnecessary (e.g., when test data 130 stored in embedded memory 110 is already in a compatible format). In some embodiments of the present invention, transmitter 108 may be configured to perform any requisite formatting operations to test data 130 it extracts from embedded memory 110. In such embodiments, the functionality of formatter 106 may be accordingly modified or removed.

When test data 130 is accessed and formatted (if necessary), test data stream 132 is transmitted by the above-described transmission circuitry to the interface on which bit error rate testing is being conducted. As illustrated in FIG. 1, transceiver 102 is being tested. It will be understood that any suitable interface may be tested in accordance with the present invention. For example, the bit error rate of internal memory interfaces may be tested. Any suitable inputs and outputs of programmable logic device 100 may also be tested using the transceiver arrangement of FIG. 1. An interface external to programmable logic device 100 and distinct and independent to programmable logic device 100 may be tested using bit error rate tester 104. For purposes of clarity and brevity, and not by way of limitation, the present invention is primarily described herein in terms of bit error rate testing being done on the transceiver arrangement illustrated in FIG. 1.

Transceiver 102 includes a transmit portion, corresponding to output 120, and a receive portion, corresponding to input 122. Test data stream 132 is transmitted via output 120 to input 122 of transceiver 102. The bit error rate of transceiver 102 is analyzed using the compare circuitry of bit error rate tester 104. The compare circuitry may include, for example, formatter 116, comparator 114, and embedded memory 118.

Embedded memory 118 may be any suitable volatile or non-volatile memory (e.g., RAM, ROM, EPROM, etc.) Embedded memory 118 stores comparison data 134. Comparison data 134 corresponds to test data 130 and is used to determine if the data stream coming in from transceiver 102 contains any errors using the comparison circuitry. For example, comparison data 134 may be identical to test data 130. Otherwise, comparison data 134 corresponds to test data 130 in some suitable way such that it may be determined whether any errors occurred during the transmission process, and if so, how many.

It will be understood that any suitable arrangement with respect to embedded memories 118 and 110 may be used in implementing bit error rate tester 104. For example, in one suitable approach, embedded memory 118 may be embedded memory 110 (e.g., with comparison data 134 being test data 130).

Formatter 116 may be any suitable circuitry configured to format the incoming bit stream from transceiver 102. Formatter 116 may pad bits, remove bits, rearrange bits, or otherwise modify the incoming bit stream in any suitable way. For example, if the incoming bit stream is in a single word format and if comparator 114 is configured to compare double words, formatter 116 may be configured to append consecutive words to form double word data to be used by comparator 114.

In some embodiments of the present invention, formatter 116 may be unnecessary (e.g., when comparison data 134 is stored in a compatible format and when comparator 114 is configured to accept the incoming bit stream in its present form). In some embodiments of the present invention, comparator 114 may be configured to perform any requisite formatting operations to the incoming bit stream. In such embodiments, the functionality of formatter 116 may be accordingly modified or removed.

When the input bit stream is formatted (if necessary), the formatted input bit stream is transmitted to comparator 114. Comparator 114 is any suitable circuitry configured to compare the incoming data to comparison data 134. Comparator 114 may maintain a counter that indicates how many errors occurred in the bits of the input data.

Bit error rate tester 104 works by sending test data 130 across transceiver 102 and to comparator 114. This is done repetitively. That is, transmitter 102 accesses and communicates test data 130 continuously such that the bit stream being communicated over transceiver 102 is a data pattern made of the repeated values represented by test data 130 (and, if applicable, as formatted by formatter 106). When bit error rate testing begins, comparator 114 may not be immediately aware at which value in the incoming data pattern comparator 114 is looking. For example, if test data 130 and comparison data 134 are both the same pattern of data made of a certain number of values, when a first value comes into comparator 114, comparator 114 may not be aware to which value in comparison data 134 the incoming value should be compared. In order to synchronize comparator 114, a process such as that shown in FIG. 2 may be used.

Figure 2:
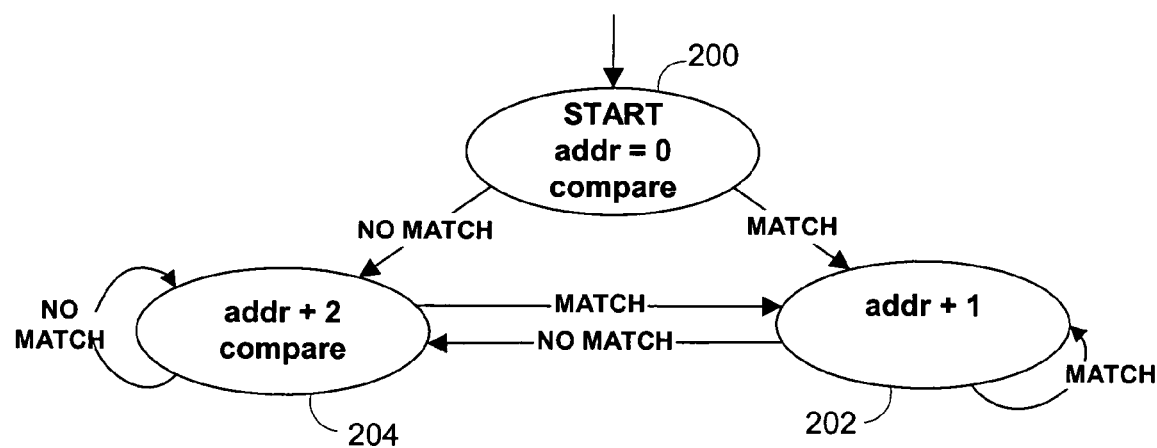
FIG. 2 is a flow-chart of illustrative steps involved in synchronizing a bit error rate tester to begin comparing incoming data from an interface being tested in accordance with one embodiment of the present invention.

FIG. 2 is a flow-chart of illustrative steps involved in synchronizing bit error rate tester 104 for comparing incoming data from transceiver 102. The circuitry that implements comparator 114 may be configured to process the steps illustrated in FIG. 2. For example, comparator 114 may use an address identifier shown as the integral variable "addr" in FIG. 2. "Addr" represents the location of the value currently being compared in comparison data 134. "Addr" is initialized to the value "0" (i.e., corresponding to a first value) when comparator 114 first begins the synchronization process at step 200.

At step 200, the value of comparison data 134 residing at address 0 is compared to the incoming data from transceiver 102. If there is a match, then at step 202, "addr" is increased by 1 and the value of comparison data 134 at address 1 is compared to the next piece of incoming data from transceiver 102. If there is another match, then the value of "addr" is increased by 1 again and the next piece of comparison data 134 is compared to the next incoming piece of data from transceiver 102. This may continue until comparator 114 determines that the data being compared do not match.

When a non-match is detected, then at step 204, "addr" is increased by 2 (i.e., to "catch up" to location of the incoming bit stream). Similarly, if at step 200, a non-match is detected, then at step 204, "addr" is increased by 2. At step 204, after "addr" has been increased by 2, another comparison is made. If there is another non-match detected, then "addr" is increased by 2 again. This continues until a match is detected at which point processing continues at step 202 as described above.

To illustrate this process, if comparison data 134 is a data stream that contains the values a, b, c, d, e, f, g, h, i, j, k corresponding to "addr" values of 0, 1, 2, 3, 4, 5, 6, 7, 8, 9, 10, respectively, and if the incoming data from transceiver 102 is c, d, e, f, g, h, i, j, k, then the progression in values of "addr" would look like 0, 2, 4, 5, 6, 7, 8, 9, 10. This corresponds to the following values stored in comparison data 134 being compared to the incoming data (i.e., in this order): a, c, e, f, g, h, i, j, k. Thus, after the first two incoming values, comparator 114 has synchronized itself to the incoming data coming from transceiver 102.

Bit error rate tester 104 may determine that synchronization has been achieved after any suitable number of consecutive matches. In one suitable approach, for example, bit error rate tester 104 may determine that synchronization has been achieved after all possible values in a particular data pattern have been consecutively matched (e.g., if a data pattern consists of a, b, c, d, e, then after consecutive matches occur for a, b, c, d, e, synchronization is achieved). Any such suitable standard may be used for gauging when synchronization has been achieved.

When bit error rate tester 104 has been synchronized, comparator 114 begins comparing each incoming value to the respective value stored in comparison data 134. Whenever a non-match is detected, an error count is updated (e.g., increased by one). Comparator 114 may be configured to compare every bit received from transceiver 102 to comparison data 134 such that the bit error rate result is not merely based on a sampling of data. Alternatively, the comparator 114 may be configured to compare only a sampling of incoming data to comparison data 134. The latter approach may be useful when, for example, a rough and quick estimate of the bit error rate is desired.

User equipment 124 is coupled to programmable logic device 100 via communications path 126. User equipment 124 may be any suitable hardware, software, or both capable of interfacing a user with the bit error rate testing functionality of the present invention. For example, user equipment 124 may be any suitable computer equipment, such as a personal computer, a personal digital assistant, a mainframe computer, or any other suitable computer equipment. The user may be given the ability to set parameters for bit error rate testing using user equipment 124 (e.g., test duration, selection of which I/O interface to test, test data pattern, etc.), view the progress or status of the testing process (e.g., via a graphical user interface on a display device,) and otherwise control bit error rate testing.

Communications path 126 may be any suitable interface for facilitating communications between programmable logic device 100 (i.e., bit error rate tester 104 in particular) and user equipment 124. For example, communications path 126 may be a serial connection (e.g., RS-232), a universal serial bus connection, a parallel port connection, an IEEE 1394 compliant connection, or any other suitable communications path.

Controller 112 may be any suitable circuitry configured to process the instructions received from user equipment 124 and to control the execution of the individual components of bit error rate tester 104. For example, controller 112 may be responsible for generating and transmitting a start signal (i.e., to begin testing), a stop signal (i.e., to end testing), and a reset signal (i.e., to reset the components to an initial state). Controller 112 may also be responsible for collecting information regarding, for example, status of testing (e.g., number of errors), and whether the components have been successfully reset following a reset instruction. Controller 112 may be used to interface with user equipment 124. For example, controller 112 may interpret commands from user equipment, may communicate information regarding testing status, and may otherwise serve as an interface between the bit error rate testing operations of programmable logic device 100 and user equipment 124. These are merely illustrative operations for which controller 112 may be responsible. It will be understood that controller 112 may be used for any other suitable operations in addition to or in place of those described.

Controller 112 may be implemented entirely in programmable logic. Alternatively, controller 112 may be at least partially implemented using hardwired digital signal processing ("DSP") logic (e.g., a microprocessor). Generally, any components of bit error rate tester 104 may be implemented entirely in programmable logic or at least partially implemented using hardware DSP.

In some embodiments of the present invention, controller 112 need not be used. For example, user equipment 124 may be configured to control the operation of bit error rate tester 104 and its components. Alternatively, or in addition, control circuitry may be programmed into the individual components of bit error rate tester 104. Any such suitable arrangement may be used in accordance with the present invention.

Figure 3:
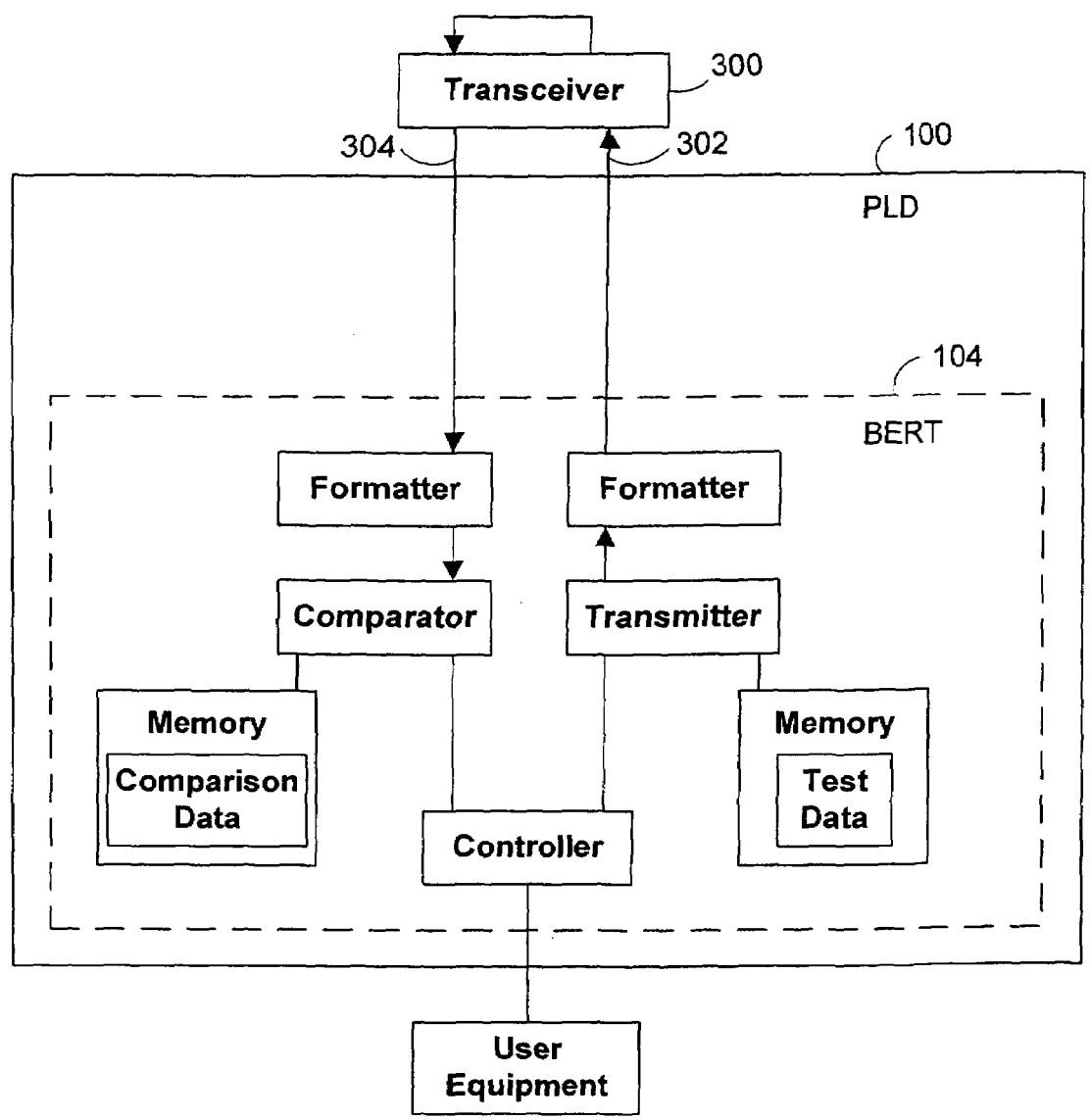
FIG. 3 is a block diagram of an illustrative bit error rate tester system that is used to test an interface external to the programmable logic device on which the bit error rate tester is implemented in accordance with one embodiment of the present invention.

FIG. 1 illustrates transceiver 102 as being an internal input/output interface within programmable logic device 100. It will be understood that bit error rate tester 104 is capable of testing interfaces external to programmable logic device 100. For example, as illustrated in FIG. 3, bit error rate tester 104 may be used to test the bit error rate of external transceiver 300. Transceiver 300 may be coupled to programmable logic device 100 (i.e., specifically, bit error rate tester 104) via communications paths 302 and 304. Communications paths 302 and 304 may be any suitable paths capable of carrying the test data between bit error rate tester 104 and transceiver 300 in accordance with the present invention.

Figure 4:
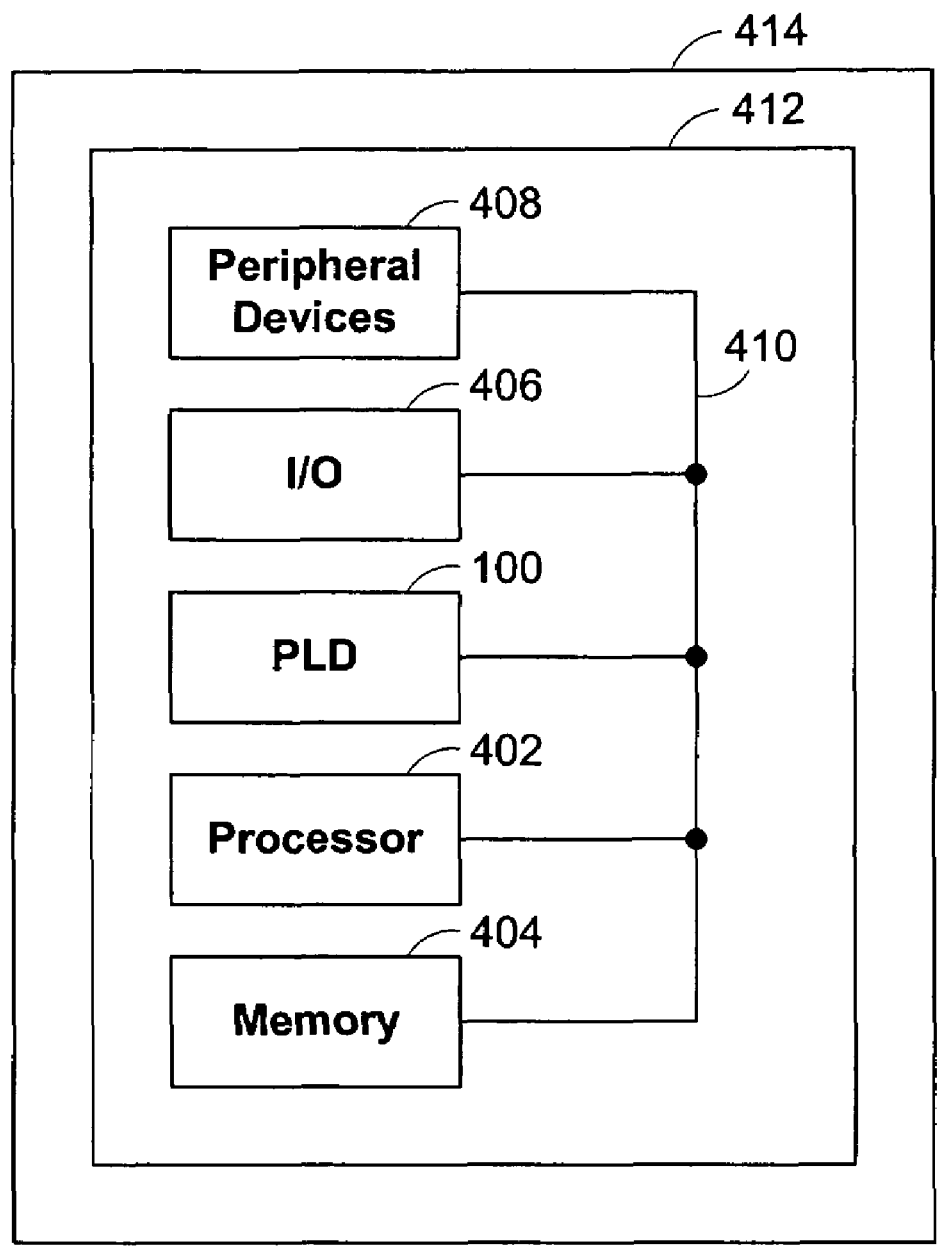
FIG. 4 is a simplified schematic diagram of an illustrative system employing a programmable logic device in accordance with one embodiment of the present invention.

FIG. 4 illustrates programmable logic device 100 (FIG. 1) of this invention (i.e., having a bit error rate tester implemented thereon) in a data processing system 400 in accordance with one embodiment of the present invention. Data processing system 400 may include one or more of the following components: a processor 402; memory 404; input/output circuitry 406; and peripheral devices 408. These components are coupled together by a system bus 410 and are populated on a circuit board 412 which is contained in an end-user system 414.

Thus, a bit error rate tester implemented in a programmable logic device is provided. One skilled in the art will appreciate that the present invention can be practiced by other than the described embodiments, which are presented for purposes of illustration and not of limitation, and the present invention is limited only by the claims which follow.

What is claimed is:

1. A bit error rate tester that tests the bit error rate of a data transmission through an interface within a programmable logic device, the bit error rate tester comprising:
   a first memory storing test data;
   a second memory storing comparison data;
   transmission circuitry implemented using programmable logic circuitry of the programmable logic device, the transmission circuitry coupled to the interface within the programmable logic device and to the first memory for communicating the test data to the interface; and
   comparison circuitry implemented using programmable logic circuitry of the programmable logic device, the comparison circuitry coupled to the interface and to the second memory for receiving incoming data from the interface and comparing the incoming data to the comparison data.

2. The bit error rate tester of claim 1 further comprising control circuitry coupled to the transmission circuitry and to the comparison circuitry.

3. The bit error rate tester of claim 2 wherein the control circuitry is implemented in the programmable logic device using programmable logic circuitry.

4. The bit error rate tester of claim 2 wherein the control circuitry is a processor.

5. The bit error rate tester of claim 1 further comprising user equipment coupled to the programmable logic device.

6. The bit error rate tester of claim 5 wherein the user equipment comprises a personal computer.

7. The bit error rate tester of claim 1 wherein the transmission circuitry comprises formatting circuitry.

8. The bit error rate tester of claim 1 wherein the comparison circuitry comprises formatting circuitry.

9. The bit error rate tester of claim 1 wherein the test data and the comparison data are the same.

10. A printed circuit board on which is mounted a programmable logic device as defined in claim 1.

11. The printed circuit board of claim 10 further comprising a memory mounted on the printed circuit board and coupled to the memory circuitry.

12. The printed circuit board of claim 11 further comprising processing circuitry mounted on the printed circuit board and couple to the memory circuitry.

13. A programmable logic device comprising programmable logic circuitry configured to:
   communicate test data to an interface within the programmable logic device;
   receive within the programmable logic device incoming data from the interface; and
   compare the incoming data to comparison data in order to determine the bit error rate of the interface, wherein the interface is internal to the programmable logic device.

14. A programmable logic device comprising programmable logic circuitry configured to implement a bit error rate tester for testing the bit error rate of data transmitted through an interface internal to the programmable logic device.

15. A method for synchronizing a comparison of incoming values with comparison values in a bit error rate tester implemented in a programmable logic device, the method comprising:
   (1) comparing an incoming value to a comparison value corresponding to an address counter;
   (2) if the incoming value matches the comparison value then increasing the address counter by one unit, otherwise increasing the address counter by two units; and
   (3) repeating (1) and (2) until a predetermined condition is met.

16. The method of claim 15 wherein (3) comprises repeating (1) and (2) until a predetermined number of consecutive matches have occurred.

17. The method of claim 15 wherein the comparison values comprises a pattern of values and wherein (3) comprises repeating (1) and (2) until all values in the pattern of values are consecutively matched.

18. The method of claim 15 further comprising:
   when the predetermined condition is met:
   (4) comparing an incoming value to a comparison value corresponding to a second address counter;
   (5) increasing the second address counter by one unit and if the incoming value does not match the comparison value then increasing a bit error counter by one; and
   (6) repeating (4) and (5) until a predetermined condition is met.

19. A method for testing the bit error rate of a data transmission through an interface using a bit error rate tester implemented in the programmable logic device, the method comprising within the programmable logic device:
   communicating test data to the interface;
   receiving incoming data from the interface;
   comparing the incoming data to comparison data in order to determine the bit error rate of the data transmission through the interface, wherein the interface is internal to the programmable logic device.

20. The method of claim 19 wherein the comparing the incoming data to the comparison data comprises synchronizing the incoming data to the comparison data.

21. A bit error rate tester that tests the bit error rate of a data transmission through an interface within a programmable logic device, the bit error rate tester comprising:
   a memory storing test data;
   transmission circuitry implemented using programmable logic circuitry of the programmable logic device, the transmission circuitry coupled to the interface within the programmable logic device and to the memory for communicating the test data to the interface; and
   comparison circuitry implemented using programmable logic circuitry of the programmable logic device, the comparison circuitry coupled to the interface and to the memory for receiving incoming data from the interface and comparing the incoming data to the test data.

22. The bit error rate tester of claim 21 further comprising control circuitry coupled to the transmission circuitry and to the comparison circuitry.

23. The bit error rate tester of claim 22 wherein the control circuitry is implemented in the programmable logic device using programmable logic circuitry.

24. The bit error rate tester of claim 22 wherein the control circuitry is a processor.

25. The bit error rate tester of claim 21 further comprising user equipment coupled to the programmable logic device.

26. The bit error rate tester of claim 25 wherein the user equipment comprises a personal computer.

27. The bit error rate tester of claim 21 wherein the transmission circuitry comprises formatting circuitry.

28. The bit error rate tester of claim 21 wherein the comparison circuitry comprises formatting circuitry.

* * * * *